(12) United States Patent
Fukasawa et al.

(10) Patent No.: US 10,215,794 B2
(45) Date of Patent: Feb. 26, 2019

(54) PARTIAL DISCHARGE SENSOR EVALUATION METHOD AND PARTIAL DISCHARGE SENSOR EVALUATION DEVICE APPARATUS

(71) Applicants: Toru Fukasawa, Tokyo (JP); Takashi Itoh, Tokyo (JP); Hiroaki Miyashita, Tokyo (JP)

(72) Inventors: Toru Fukasawa, Tokyo (JP); Takashi Itoh, Tokyo (JP); Hiroaki Miyashita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 407 days.

(21) Appl. No.: 14/763,918

(22) PCT Filed: Feb. 12, 2013

(86) PCT No.: PCT/JP2013/053234
§ 371 (c)(1),
(2) Date: Jul. 28, 2015

(87) PCT Pub. No.: WO2014/125563
PCT Pub. Date: Aug. 21, 2014

(65) Prior Publication Data
US 2015/0346267 A1 Dec. 3, 2015

(51) Int. Cl.
*G01R 31/12* (2006.01)
*G01R 29/08* (2006.01)
(Continued)

(52) U.S. Cl.
CPC ..... *G01R 31/1254* (2013.01); *G01R 29/0878* (2013.01); *G01R 29/0892* (2013.01);
(Continued)

(58) Field of Classification Search
CPC ..... G01R 29/0878; G01R 31/14; G01R 29/10
See application file for complete search history.

(56) References Cited

U.S. PATENT DOCUMENTS 6,300,768 B1 * 10/2001 Kato ............... G01R 31/1254
324/122
7,183,774 B2 * 2/2007 Kuppuswamy .... G01R 31/1254
324/536
(Continued)

FOREIGN PATENT DOCUMENTS

GB    2474125 A     4/2011
JP    63-200075 A   8/1988
(Continued)

OTHER PUBLICATIONS

An Office Action issued by the GB Intellectual Property Office dated Mar. 31, 2017, which corresponds to GB Patent Application No. GB1511818 5 and is related to U.S. Appl. No. 14/763,918.
(Continued)

*Primary Examiner* — Huy Q Phan
*Assistant Examiner* — Adam Clarke
(74) *Attorney, Agent, or Firm* — Studebaker & Brackett PC

(57) ABSTRACT

A partial discharge sensor evaluation method includes a first frequency characteristic measuring process in which, in a state where a reference antenna 3 for which a frequency characteristic in an effective height is known and a measuring antenna 2 are installed on a flat ground 1 to be separated by a predetermined distance from each other, a transmission characteristic measurer 4 measures a frequency characteristic of a transmission characteristic between the reference antenna 3 and the measuring antenna 2, and a second frequency characteristic measuring process in which, in a state where a measured antenna 9 is installed inside a cylindrical ground 6 buried in a circular opening 5 formed
(Continued)

at a position where the reference antenna 3 has been installed, the transmission characteristic measurer 4 measures the frequency characteristic of the transmission characteristic between the measured antenna 9 and the measuring antenna 2.

9 Claims, 13 Drawing Sheets

(51) Int. Cl.
    *G01R 35/00* (2006.01)
    *G01R 31/14* (2006.01)
    *G01R 29/10* (2006.01)

(52) U.S. Cl.
    CPC .............. *G01R 31/14* (2013.01); *G01R 35/00* (2013.01); *G01R 29/10* (2013.01)

(56) References Cited

U.S. PATENT DOCUMENTS

| | | | | |
|---|---|---|---|---|
| 2002/0163344 A1* | 11/2002 | Rokunohe | ............... | H01L 22/34 324/550 |
| 2004/0246000 A1* | 12/2004 | Kuppuswamy | .... | G01R 31/1254 324/536 |
| 2007/0139056 A1* | 6/2007 | Kaneiwa | ............ | G01R 31/1227 324/536 |
| 2014/0002099 A1 | 1/2014 | Fukasawa et al. | | |
| 2015/0160282 A1* | 6/2015 | Candela | ............. | G01R 31/1227 324/551 |
| 2015/0260777 A1* | 9/2015 | Di Stefano | ........ | G01R 31/1227 324/536 |
| 2015/0369853 A1* | 12/2015 | Chen | .................. | G01R 31/1254 324/415 |

FOREIGN PATENT DOCUMENTS

| | | |
|---|---|---|
| JP | 2007-033197 A | 2/2007 |
| WO | 2012/137254 A1 | 10/2012 |

OTHER PUBLICATIONS

O. Farish, MD Judd, and P.F. Coventry"UHF Couplers for GIS—Sensitivity and Specification"; Proc. 10th Int. Symp. on High Voltage Engineering (Montreal); vol. 6; Aug. 1997.

International Search Report for application No. PCT/JP2013/053234 dated Apr. 23, 2013.

* cited by examiner

FIG.2
(a)
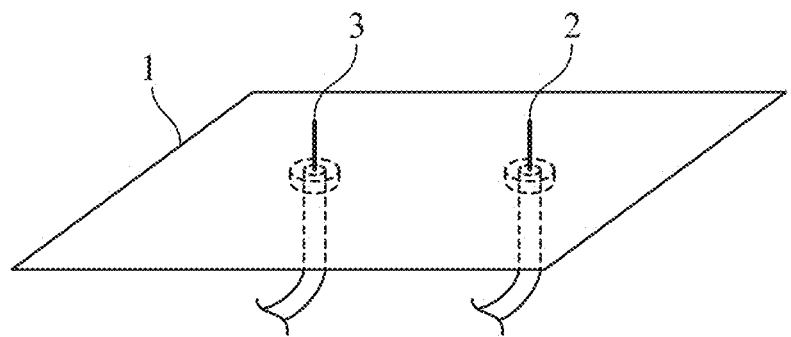
(b)
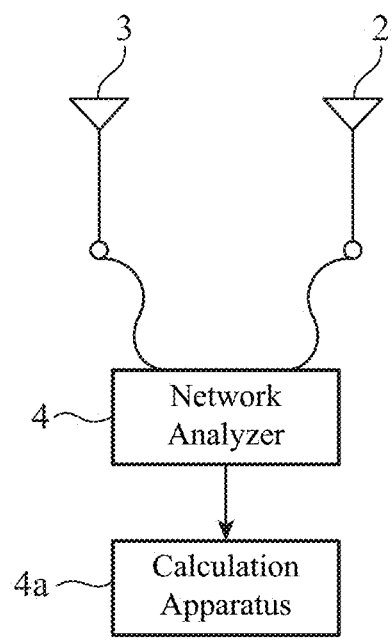

FIG.3
(a)
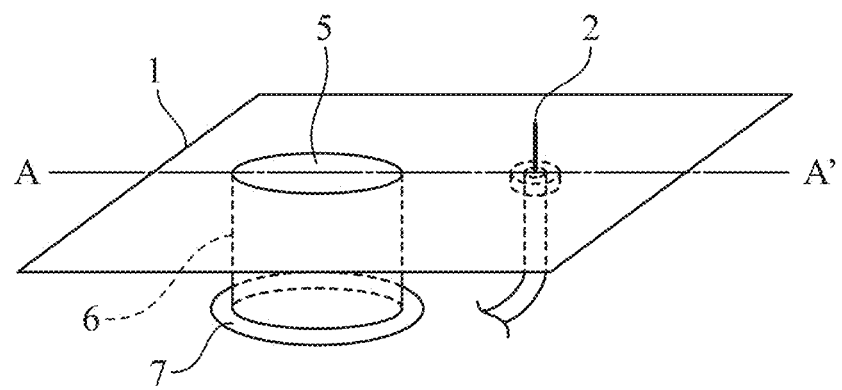
(b)
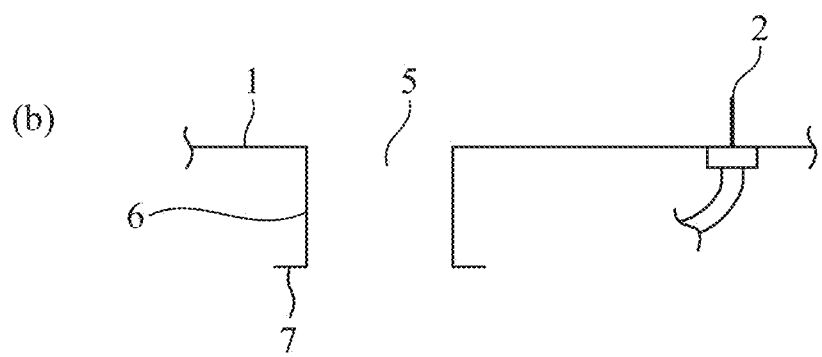

FIG.4
(a)
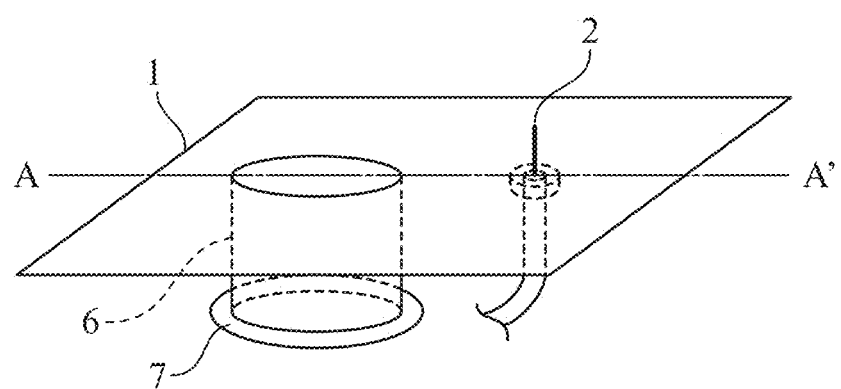
(b)
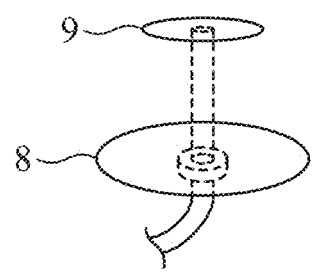

FIG.5
(a)
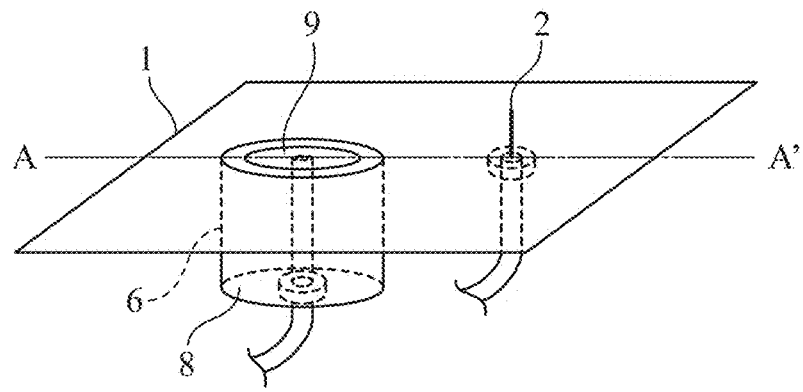
(b)
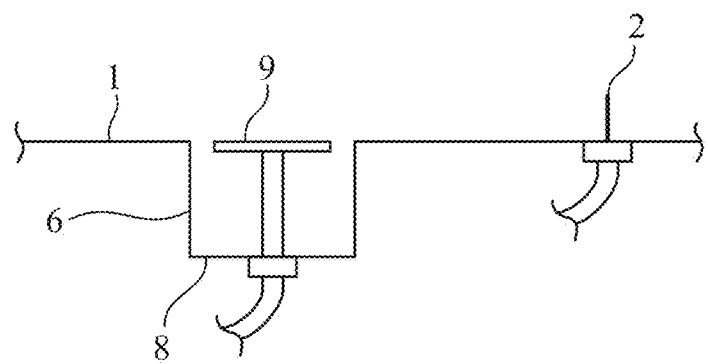
(c)
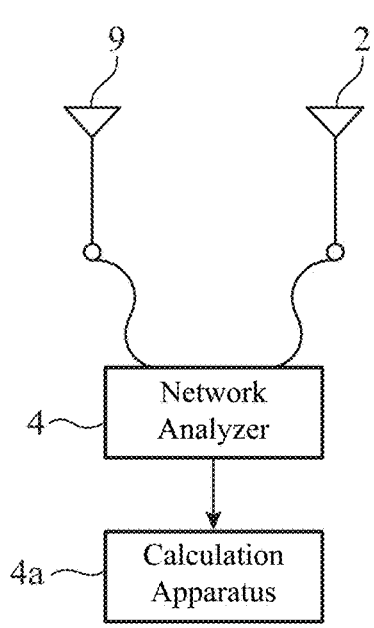

FIG.7
(a)
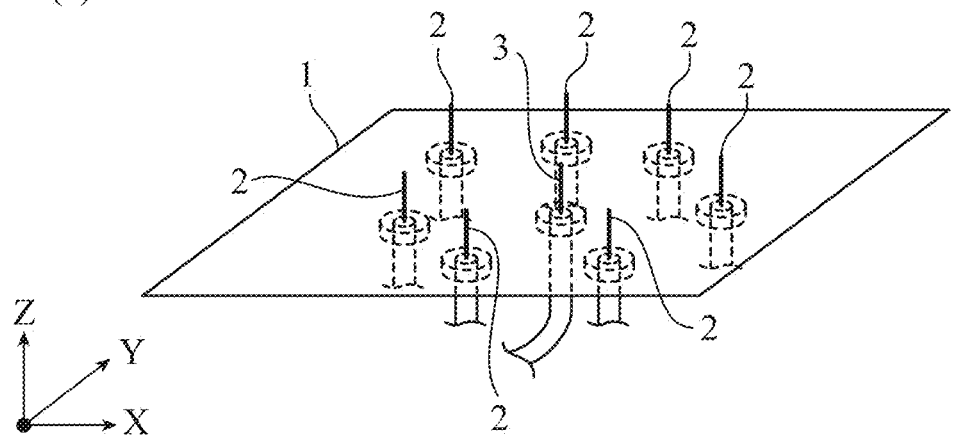
(b)
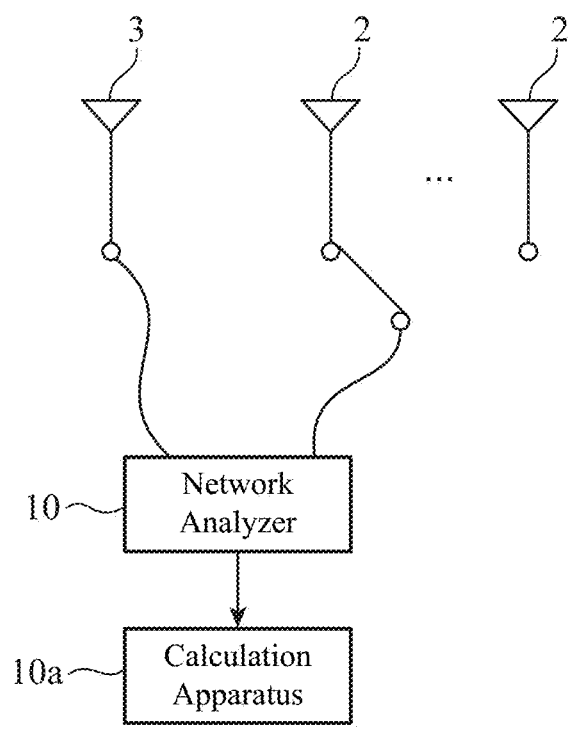

FIG.8
(a)
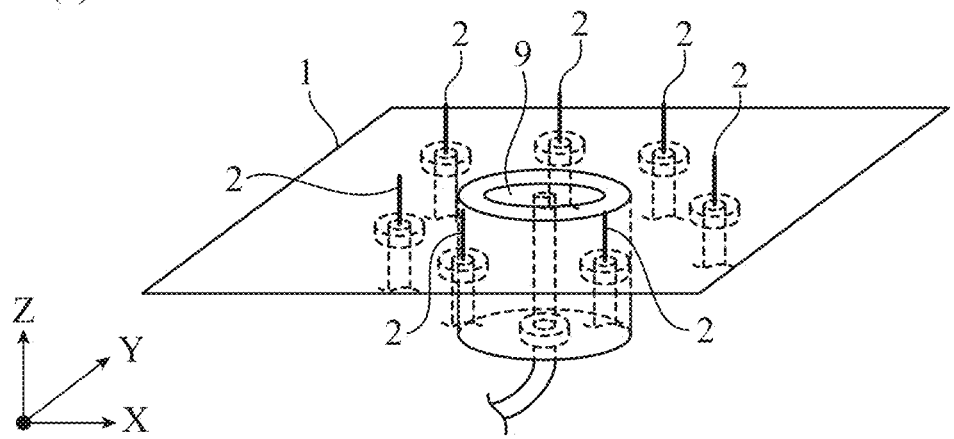
(b)
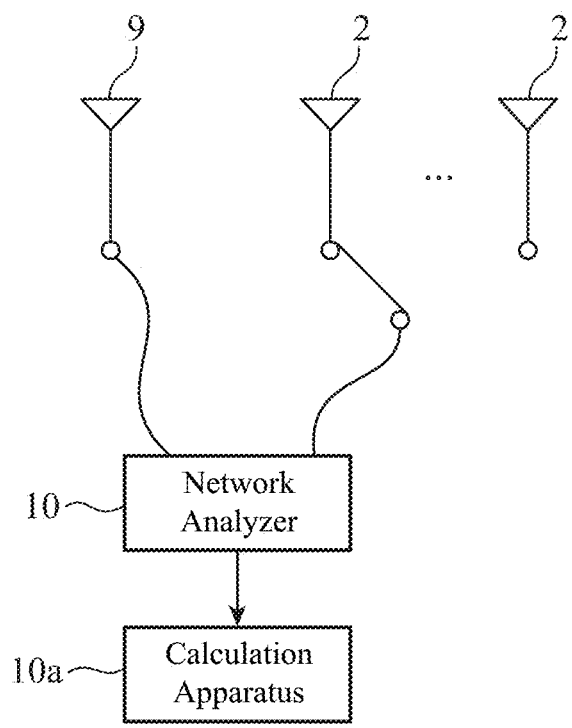

FIG.10
(a)
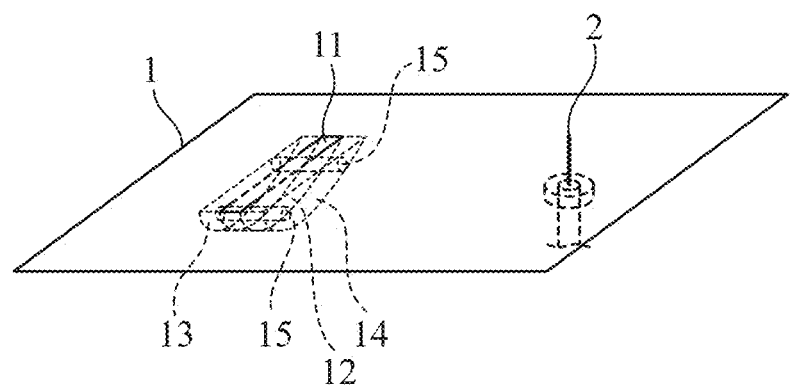
(b)
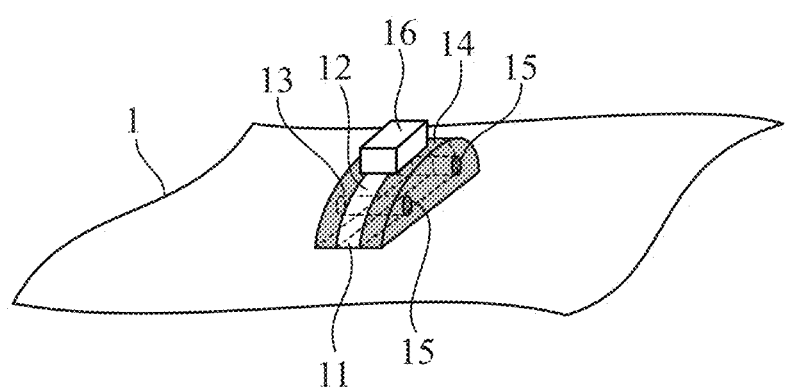

FIG.11
(a)
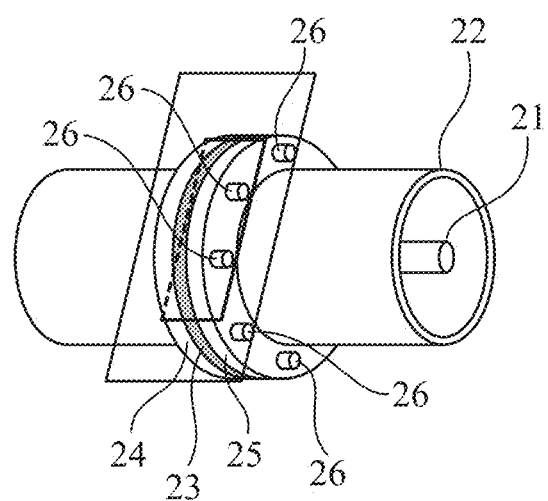
(b)
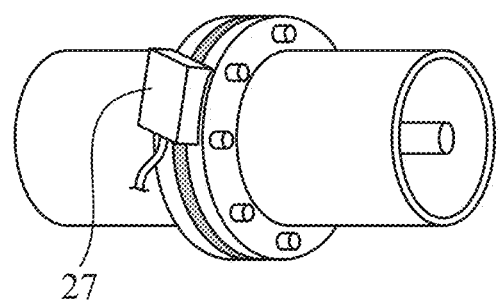

PARTIAL DISCHARGE SENSOR EVALUATION METHOD AND PARTIAL DISCHARGE SENSOR EVALUATION DEVICE APPARATUS

TECHNICAL FIELD

The present invention relates to a partial discharge sensor evaluation method and a partial discharge sensor evaluation apparatus to be used when detecting a high frequency generated in an apparatus in a high power facility such as a GIS (Gas Insulated Switchgear) to detect a partial discharge phenomenon.

BACKGROUND ART

FIG. 16 is a configuration diagram depicting a partial discharge sensor evaluation apparatus disclosed in Non-Patent Literature 1 illustrated below.

Upon receiving a high frequency generated by a signal source 101, a G-TEM cell 102 converts the high frequency into a substantially plane wave, and propagates the plane wave.

Thus, a partial discharge sensor 103 is irradiated with a polarized wave perpendicular to a metal surface on which the sensor is installed.

A digitizer 104 compares the intensity of a radio wave received by the partial discharge sensor 103 with that of the high frequency generated by the signal source 101 to measure a transmission characteristic from the signal source 101 to the partial discharge sensor 103.

Further, when a reference antenna with a known effective height of antenna is installed instead of the partial discharge sensor 103, the digitizer 104 measures a transmission characteristic from the signal source 101 to the reference antenna.

It is possible to determine the effective height of antenna of the partial discharge sensor 103 when the transmission characteristic from the signal source 101 to the partial discharge sensor 103 is compared with the transmission characteristic from the signal source 101 to the reference antenna.

Furthermore, it is possible to determine a frequency characteristic in the effective height of antenna when a similar measurement is performed while the frequency of the signal source 101 is varied, and a value in which these frequency characteristics are averaged at a prescribed frequency is generally used as an index for the partial discharge sensor 103.

CITATION LIST

Patent Document

Non-Patent Literature 1: M. D. Judd, "UHF Couplers for GIS-Sensitivity and Specification," Proc. 10th Int. Symp. on High Voltage Engineering, vol. 6, August 1997

SUMMARY OF THE INVENTION

Problems to be Solved by the Invention

The conventional partial discharge sensor evaluation apparatus is configured as mentioned above, and thus, the effective height of antenna of the partial discharge sensor 103 can be determined. However, the G-TEM cell 102 has a large size exceeding 3 m, which increases the size of the whole apparatus; consequently, there is a problem such that the apparatus is constrained in terms of an installation site and the like.

The present invention has been made in order to solve the above-described problem, and an object of the invention is to provide a partial discharge sensor evaluation method and a partial discharge sensor evaluation apparatus that can achieve reduction in size of the whole apparatus.

Means for Solving the Problems

A partial discharge sensor evaluation method according to the present invention includes: a first frequency characteristic measuring process in which, in a state where a reference antenna for which a frequency characteristic in an effective height is known and a measuring antenna are installed on a flat ground to be separated by a predetermined distance from each other, a transmission characteristic measurer measures a frequency characteristic of a transmission characteristic between the reference antenna and the measuring antenna; a second frequency characteristic measuring process in which, in a state where the reference antenna is removed, and a measured antenna is installed inside a cylindrical ground buried in a circular opening formed at a position where the reference antenna has been installed, the transmission characteristic measurer measures the frequency characteristic of the transmission characteristic between the measured antenna and the measuring antenna; and a calculation process in which a calculation apparatus calculates the frequency characteristic in an effective height of the measured antenna based on the frequency characteristic of the transmission characteristic measured in the first frequency characteristic measuring process and the frequency characteristic of the transmission characteristic measured in the second frequency characteristic measuring process.

Effect of the Invention

According to the present invention, there is an advantageous effect such that the frequency characteristic in the effective height of the measured antenna can be calculated without the use of a large G-TEM cell to thereby achieve reduction in size of the whole apparatus.

BRIEF DESCRIPTION OF THE DRAWINGS

FIG. 2 is a diagram illustrating a state where a measuring antenna 2 and a reference antenna 3 are installed on a flat ground 1.

FIG. 3 is a diagram depicting a state where a cylindrical ground 6 in which a measured antenna 9 is installed is buried in a circular opening 5.

FIG. 4 is a diagram illustrating the measured antenna 9 installed inside the cylindrical ground 6.

FIG. 5 is a diagram illustrating a state where the measured antenna 9 is installed on the flat ground 1.

FIG. 7 is a diagram illustrating a state where a plurality of measuring antennas 2 and a reference antenna 3 are installed on a flat ground 1.

FIG. 8 is a diagram illustrating a state where the plurality of measuring antennas 2 and a measured antenna 9 are installed on the flat ground 1.

FIG. 10 is diagram illustrating a state of a side where a measuring antenna 2 is installed and a state of a side where a measured antenna 16 is installed.

FIG. 11 is a perspective view depicting a high-voltage electric line installed in a GIS.

MODES FOR CARRYING OUT THE INVENTION

Embodiment 1

Figure 1:
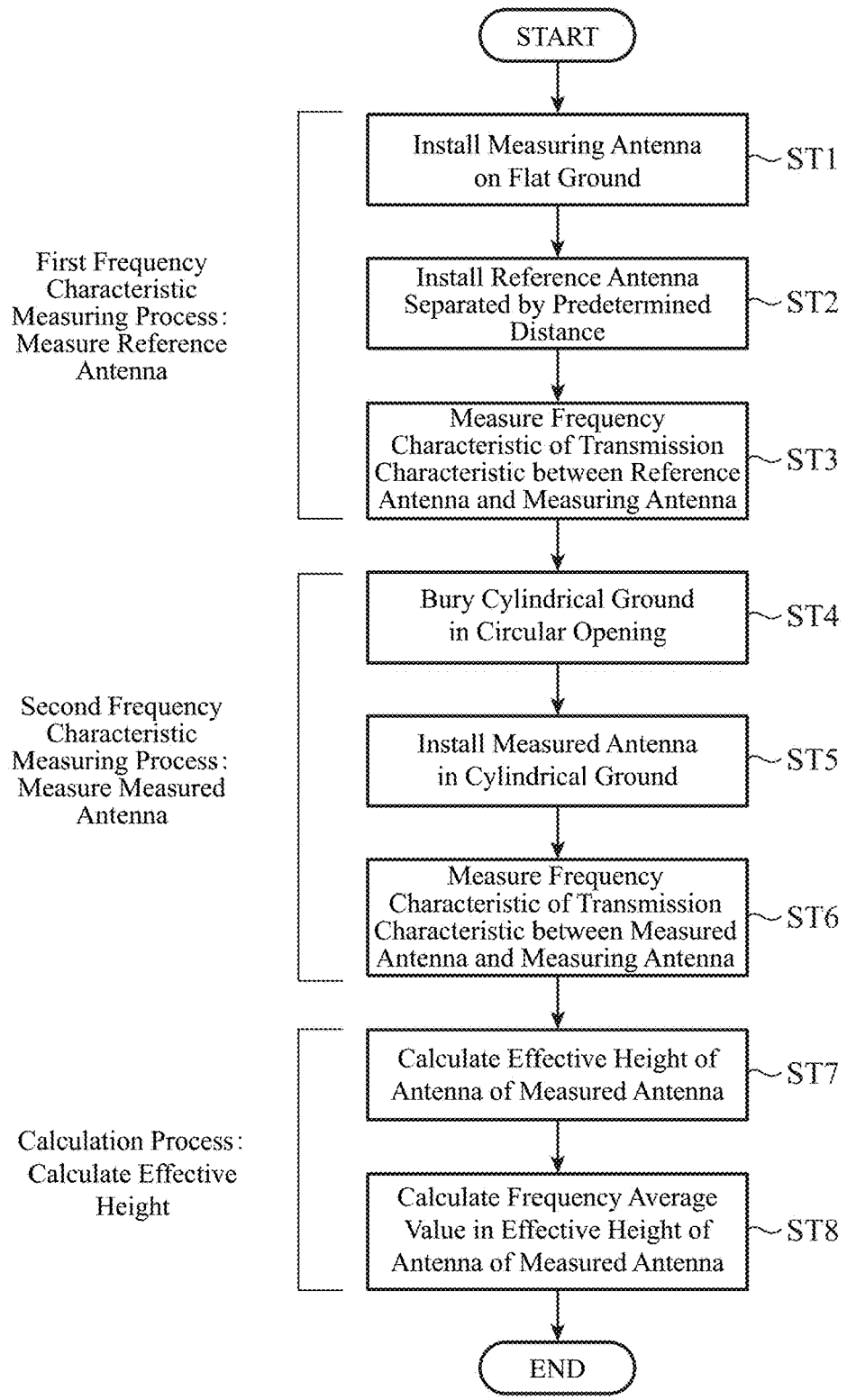
FIG. 1 is a flowchart depicting a partial discharge sensor evaluation method according to Embodiment 1 of the present invention.

FIG. 1 is a flowchart illustrating a partial discharge sensor evaluation method according to Embodiment 1 of the present invention.

FIG. 2 is a diagram illustrating a state where a measuring antenna 2 and a reference antenna 3 are installed on a flat ground 1.

In FIG. 2, the flat ground 1 is a metal plate on which the measuring antenna 2 and the reference antenna 3 are to be installed.

The measuring antenna 2 is formed of, for example, a monopole antenna and installed on the flat ground 1.

The monopole antenna radiates a high frequency in a plane orthogonal to a longitudinal direction of the monopole antenna (side direction) when the length of the monopole antenna is equal to or smaller than a half wavelength. A measured antenna 9 described below (see FIG. 5) is installed in the side direction of the measuring antenna 2 that is the monopole antenna, and thus, the length of the monopole antenna is set to be equal to or smaller than the half wavelength of a maximum frequency to be measured.

The reference antenna 3 is the antenna for which a frequency characteristic in an effective height of antenna heff_ref(f) is known, and is installed to be separated by a predetermined distance from the measuring antenna 2.

Additionally, any antenna may be employed for the reference antenna 3 as long as the effective height of antenna heff_ref(f) is known; however, as disclosed in Non-Patent Literature 1, in general, a 25-mm monopole antenna is employed.

Measurement accuracy thereof is enhanced as the predetermined distance (distance between the measuring antenna 2 and the reference antenna 3) is larger.

For example, when a diameter of a circular opening 5 of the measured antenna 9 described below to the flat ground 1 is denoted as D, given that the predetermined distance is equal to or larger than (D×D/wavelength), the measurement accuracy is achieved which is equivalent to that in a case where the measuring antenna 2 and the reference antenna 3 are sufficiently separated from each other.

A network analyzer 4 executes processing of measuring a frequency characteristic E_ref(f) of a transmission characteristic between the reference antenna 3 and the measuring antenna 2, and also measuring a frequency characteristic E_dut(f) of a transmission characteristic between the measured antenna 9 described below and the measuring antenna 2. Note that the network analyzer 4 constitutes a transmission characteristic measurer.

A calculation apparatus 4a includes, for example, a personal computer, and executes processing of calculating a frequency characteristic heff(f) in the effective height of the measured antenna 9 based on the frequency characteristic E_ref(f) of the transmission characteristic between the reference antenna 3 and the measuring antenna 2 measured by the network analyzer 4 and the frequency characteristic E_dut(f) of the transmission characteristic between the measured antenna 9 and the measuring antenna 2 measured by the network analyzer 4, and also calculating a frequency average value heff_average in the effective height. Note that the calculation apparatus 4a constitutes an effective-height-frequency characteristic calculator.

FIG. 3 is a diagram illustrating a state where a cylindrical ground 6 in which the measured antenna 9 is installed is buried in the circular opening 5. FIG. 4 is a diagram illustrating the measured antenna 9 installed inside the cylindrical ground 6.

In addition, FIG. 5 is a diagram illustrating a state where the measured antenna 9 is installed with the flat ground 1.

In FIGS. 3 to 5, the circular opening 5 is a circular opening part formed at a position where the reference antenna 3 is installed.

The cylindrical ground 6 is a cylindrical metal member buried in the circular opening 5, and a flange 7 is connected to a lower portion thereof. Further, the flange 7 is connected to an antenna ground 8.

The measured antenna 9 is installed on the antenna ground 8 in the cylindrical ground 6.

Next, an operation will be described.

A first frequency characteristic measuring process of steps ST1 to ST3 will be initially described.

First, in order to measure the frequency characteristic E_ref(f) of the transmission characteristic between the reference antenna 3 and the measuring antenna 2, the measuring antenna 2 that is the monopole antenna is installed on the flat ground 1 as depicted in FIG. 2 (step ST1 in FIG. 1).

Then, the reference antenna 3 for which the frequency characteristic of the effective height of antenna heff_ref(f) is known is installed on the flat ground 1 to be separated by the predetermined distance from the measuring antenna 2 (step ST2).

In this regard, the predetermined distance is such a distance as will be equal to or larger than (D×D/wavelength) given that the diameter of the circular opening 5 is D as mentioned above.

When the reference antenna 3 and the measuring antenna 2 are installed on the flat ground 1, the network analyzer 4 measures the frequency characteristic E_ref(f) of the transmission characteristic between the reference antenna 3 and the measuring antenna 2 (step ST3).

Next, a second frequency characteristic measuring process of steps ST4 to ST6 will be described.

First, the reference antenna 3 is removed from the flat ground 1, and then, as depicted in FIG. 3, the circular opening 5 is formed at a position where the reference antenna 3 has been installed, and the cylindrical ground 6 with the flange 7 connected to the lower portion thereof is buried in the circular opening 5 (step ST4).

Then, the flange 7 of the cylindrical ground 6 is connected to the antenna ground 8, and as depicted in FIG. 5, the measured antenna 9 is installed on the antenna ground 8 in the cylindrical ground 6 (step ST5).

When the measured antenna 9 is installed in the cylindrical ground 6, the network analyzer 4 measures the frequency characteristic E_dut(f) of the transmission characteristic between the measured antenna 9 and the measuring antenna 2 (step ST6).

Next, a calculation process of steps ST7 and ST8 will be described. When the frequency characteristic E_ref(f) of the transmission characteristic between the reference antenna 3 and the measuring antenna 2 and the frequency characteristic E_dut(f) of the transmission characteristic between the measured antenna 9 and the measuring antenna 2 are measured, the calculation apparatus 4a calculates the frequency characteristic heff(f) in the effective height of the measured antenna 9 by substituting the frequency characteristic E_ref(f) and the frequency characteristic E_dut(f) into the following Expression (1) (step ST7).

$$heff(f) = heff\_ref(f) * \frac{|E\_dut(f)|}{|E\_ref(f)|} \qquad (1)$$

In Expression (1), the heff_ref(f) designates the effective height of antenna of the reference antenna 3.

Upon calculating the frequency characteristic heff(f) in the effective height of the measured antenna 9, the calculation apparatus 4a calculates the frequency average value heff_average in the effective height as illustrated in the following Expression (2) (step ST8).

In this case, the network analyzer 4 performs a similar measurement while the frequency of a radio wave supplied to the measuring antenna 2 (prescribed frequency) is varied, and the frequency characteristic heff(f) in the effective height is averaged at a prescribed frequency. As the prescribed frequency, for example, the one of 500 MHz to 1500 MHz is used.

$$heff\_average = \frac{1}{fH - fL} \int_{fL}^{fH} heff(f) df \qquad (2)$$

The measuring antenna 2 that is the monopole antenna installed on the flat ground 1 radiates a polarized wave perpendicular to the flat ground 1, and a high frequency propagates along the flat ground 1. Therefore, when the measuring antenna 2 and the measured antenna 9 are installed as depicted in FIG. 5, the polarized wave perpendicular to the flat ground 1 can be irradiated to a side surface of the measured antenna 9, similarly to a case where a G-TEM cell is used.

As a result, the procedure illustrated in steps ST1 to ST8 enables an evaluation that is equivalent to that in the case where the G-TEM cell is used.

For example, on the assumption that the diameter of the circular opening 5 is "350 mm" and that a frequency to be observed is 500 MHz to 1500 MHz, the predetermined distance has a maximum value of "612 mm."

For this reason, the length of the flat ground 1 is within approximately 1 m at a maximum, and thus, an evaluation facility with a smaller installation area can be established as compared to the G-TEM cell.

Furthermore, the G-TEM cell can be replaced with the single flat ground 1, which enables cost reduction of the facility itself.

As is apparent from the above description, according to Embodiment 1, the frequency characteristic heff(f) in the effective height of the measured antenna 9 and the frequency average value heff_average in the effective height can be calculated without the use of the large G-TEM cell, which provides an advantageous effect that can achieve reduction in size of the whole apparatus.

Embodiment 2

Figure 6:
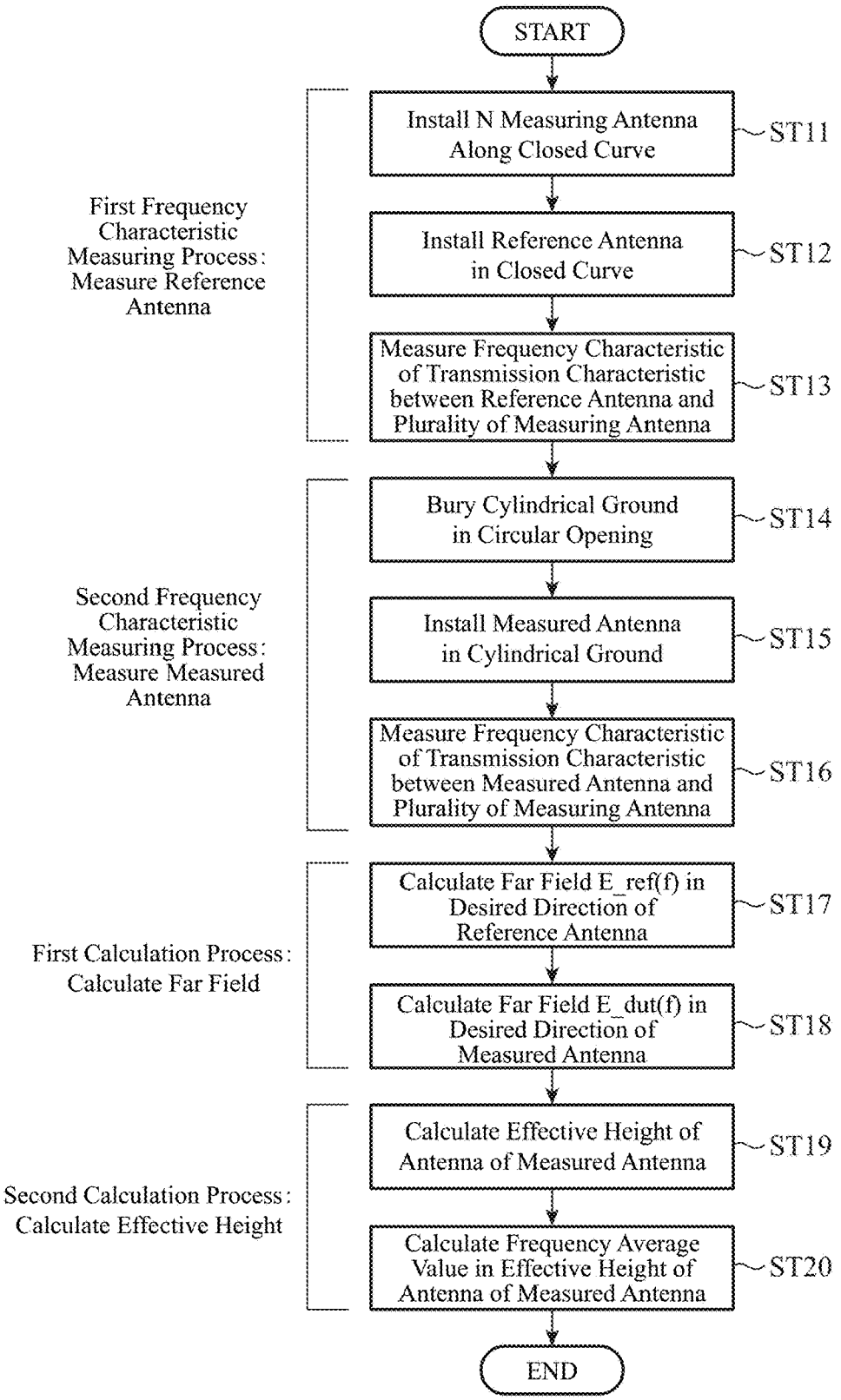
FIG. 6 is a flowchart depicting a partial discharge sensor evaluation method according to Embodiment 2 of the present invention.

FIG. 6 is a flowchart illustrating a partial discharge sensor evaluation method according to Embodiment 2 of the present invention.

FIG. 7 is a diagram illustrating a state where a plurality of measuring antennas 2 and a reference antenna 3 are installed on a flat ground 1. FIG. 8 is a diagram illustrating a state where the plurality of measuring antennas 2 and a measured antenna 9 are installed on the flat ground 1.

In the above Embodiment 1, there is illustrated the case that the measuring antenna 2 and the reference antenna 3 (measured antenna 9) are installed on the flat ground 1 with separated by the predetermined distance from each other, while in Embodiment 2, it is different from Embodiment 1 in that the N measuring antennas 2 are arranged around the reference antenna 3 (measured antenna 9) (disposed along a closed curve). Note that N designates an integer of 2 or more.

A network analyzer 10 measures executes processing of measuring a frequency characteristic E'_ref_i(f) of a transmission characteristic between the reference antenna 3 and the N measuring antennas 2, and measuring a frequency characteristic E'_dut_i(f) of a transmission characteristic between the measured antenna 9 and the N measuring antennas 2. Note that the network analyzer 10 constitutes a transmission characteristic measurer.

A calculation apparatus 10a includes, for example, a personal computer, and executes processing of calculating an electric field E_ref(f) at a point separated by a predetermined distance or longer from the reference antenna 3 based on the frequency characteristic E'_ref_i(f) of the transmission characteristic between the reference antenna 3 and the N measuring antennas 2 measured by the network analyzer 10, and also calculating an electric field E_dut(f) at the point separated by the predetermined distance or longer from the measured antenna 9 based on the frequency characteristic E'_dut_i(f) of the transmission characteristic between the measured antenna 9 and the N measuring antennas 2.

In addition, the calculation apparatus 10a executes processing of calculating a frequency characteristic heff(f) in an effective height of the measured antenna 9 based on the electric fields E_ref(f) and E_dut(f) at both the points, and also calculating a frequency average value heff_average in the effective height. Note that the calculation apparatus 10a constitutes an effective-high-frequency characteristic calculator.

Next, an operation will be described.

A first frequency characteristic measuring process of steps ST11 to ST13 will be initially described.

First, in order to measure a frequency characteristic E_ref(f) of a transmission characteristic between the reference antenna 3 and the measuring antennas 2, the N measuring antennas 2 that are monopole antennas are installed on the flat ground 1 along the closed curve as depicted in FIG. 7 (step ST11 in FIG. 6).

Then, the reference antenna 3 for which a frequency characteristic in the effective height of antenna heff_ref(f) is known is installed at any position in the closed curve (step ST12).

In this manner, the N measuring antennas 2 may be arranged around the reference antenna 3.

When the reference antenna 3 and the N measuring antennas 2 are installed on the flat ground 1, the network analyzer 10 measures the frequency characteristic E'_ref_i(f) of the transmission characteristic between the reference antenna 3 and the N measuring antennas 2 while the measuring antenna 2 to be measured is switched among the N measuring antennas 2 by a switch (step ST13). Here, i=1, 2, . . . , N.

Next, a second frequency characteristic measuring process of steps ST14 to ST16 will be described.

Similarly to the above Embodiment 1, the reference antenna 3 is removed from the flat ground 1, a circular opening 5 is formed at a position where the reference antenna 3 has been installed, and a cylindrical ground 6 with a flange 7 connected to a lower portion thereof is buried in the circular opening 5 (step ST14).

Then, the flange 7 of the cylindrical ground 6 is connected to an antenna ground 8, and the measured antenna 9 is installed on the antenna ground 8 in the cylindrical ground 6 (step ST15).

When the measured antenna 9 is installed in the cylindrical ground 6, the network analyzer 10 measures a frequency characteristic E'_dut_i(f) of a transmission characteristic between the measured antenna 9 and the N measuring antennas 2 while the measuring antenna 2 to be measured is switched among the N measuring antennas 2 by the switch (step ST16). Here, i=1, 2, . . . , N.

Next, a calculation process of steps ST17 to ST20 will be described. Upon measuring the frequency characteristic E'_ref_i(f) of the transmission characteristic between the reference antenna 3 and the N measuring antennas 2, and the frequency characteristic E'_dut_i(f) of the transmission characteristic between the measured antenna 9 and the N measuring antennas 2, the calculation apparatus 10a calculates the electric field E_ref(f) at the point separated by the predetermined distance or longer from the reference antenna 3 (corresponding to the left side of Expression (3)) based on the frequency characteristic E'_ref_i(f) of the transmission characteristic between the reference antenna 3 and the N measuring antennas 2 as shown in the following Expression (3) (step ST17).

$$\text{E\_ref}(\theta = \pi, \phi = 0) = \left\{-j\omega\left[\overline{A} + \frac{1}{k^2}\nabla(\nabla \cdot \overline{A})\right] - \frac{1}{\varepsilon_0}\nabla \times \overline{F}\right\}\Big|_{\theta=\pi,\phi=0} \quad (3)$$

$$\overline{A} = \frac{\mu_0}{4\pi}\sum \overline{J}_i \frac{e^{-jkR}}{R}\frac{2\pi}{N}$$

$$\overline{F} = \frac{\varepsilon_0}{4\pi}\sum \overline{M}_i \frac{e^{-jkR}}{R}\frac{2\pi}{N}$$

$$\overline{J}_i = \overline{n} \times \overline{n} \times \overline{E}'\_\text{ref\_i}$$

$$\overline{M}_i = -\overline{n} \times \overline{E}'\_\text{ref\_i}$$

R: Distance between the position of the measuring antenna and the position of an observation point
k: 2π/wavelength Note that the distance R is the distance between the coordinates of each measuring antenna 2 and the coordinates of the observation point set at a sufficiently longer distance from the reference antenna 3 as compared to $D^2/\lambda$. D designates the size of the measuring antenna 2, and λ designates a wavelength. A vector n is a normal vector which is present in the plane of the flat ground 1 and which is directed outward with respect to the above closed curve.

Furthermore, the calculation apparatus 10a calculates the electric field E_dut(f) at the point separated by the predetermined distance or longer from the measured antenna 9 (corresponding to the left side of Expression (4)) based on the frequency characteristic E'_dut_i(f) of the transmission characteristic between the measured antenna 9 and the N measuring antennas 2 as shown in the following Expression (4) (step ST18).

$$\text{E\_dut}(\theta = \pi, \phi = 0) = \left\{-j\omega\left[\overline{A} + \frac{1}{k^2}\nabla(\nabla \cdot \overline{A})\right] - \frac{1}{\varepsilon_0}\nabla \times \overline{F}\right\}\Big|_{\theta=\pi,\phi=0} \quad (4)$$

$$\overline{A} = \frac{\mu_0}{4\pi}\sum \overline{J}_i \frac{e^{-jkR}}{R}\frac{2\pi}{N}$$

$$\overline{F} = \frac{\varepsilon_0}{4\pi}\sum \overline{M}_i \frac{e^{-jkR}}{R}\frac{2\pi}{N}$$

$$\overline{J}_i = \overline{n} \times \overline{n} \times \overline{E}'\_\text{dut\_i}$$

$$\overline{M}_i = -\overline{n} \times \overline{E}'\_\text{dut\_i}$$

R: Distance between the position of the measuring antenna and the position of the observation point
k: 2π/wavelength Note that the distance R is the distance between the coordinates of each measuring antenna 2 and the coordinates of the observation point set at the sufficiently longer distance from the measured antenna 9 as compared to $D^2/\lambda$. D designates the size of the measuring antenna 2, and λ designates the wavelength. The vector n is the normal vector which is present in the plane of the flat ground 1 and which is directed outward with respect to the above closed curve.

Upon calculating the electric fields E_ref(f) and E_dut(f) at both the points, the calculation apparatus 10a calculates the frequency characteristic heff(f) in the effective height of the measured antenna 9 by substituting the electric fields E_ref(f) and E_dut(f) at both the points into the above Expression (1) (step ST19).

Upon calculating the frequency characteristic heff(f) in the effective height of the measured antenna, the calculation apparatus 10a calculates the frequency average value heff_average in the effective height as shown in the above Expression (2) (step ST20).

In this case, a similar measurement is performed by the network analyzer 10 and the calculation apparatus 10a while the frequency of a radio wave supplied to the measuring antenna 2 (prescribed frequency) is varied, and the frequency characteristic heff(f) in the effective height is averaged at the prescribed frequency. As the prescribed frequency, for example, the one of 500 MHz to 1500 MHz is used.

Performing the above steps ST11 to ST20 enables an evaluation that is equivalent to that in a case where the G-TEM cell is used.

In Embodiment 2, the N measuring antennas 2 arranged around the measured antenna 9 are used to calculate an equivalent far field, thus calculating a transmission characteristic corresponding to a case where the measured antenna element 9 and the measuring antenna 2 are sufficiently distant from each other; consequently, the distance between the measured antenna element 9 and the measuring antenna 2 can be reduced. As a result, it is possible to achieve further reduction in size of the apparatus as compared to the above Embodiment 1.

Embodiment 3

Figure 9:
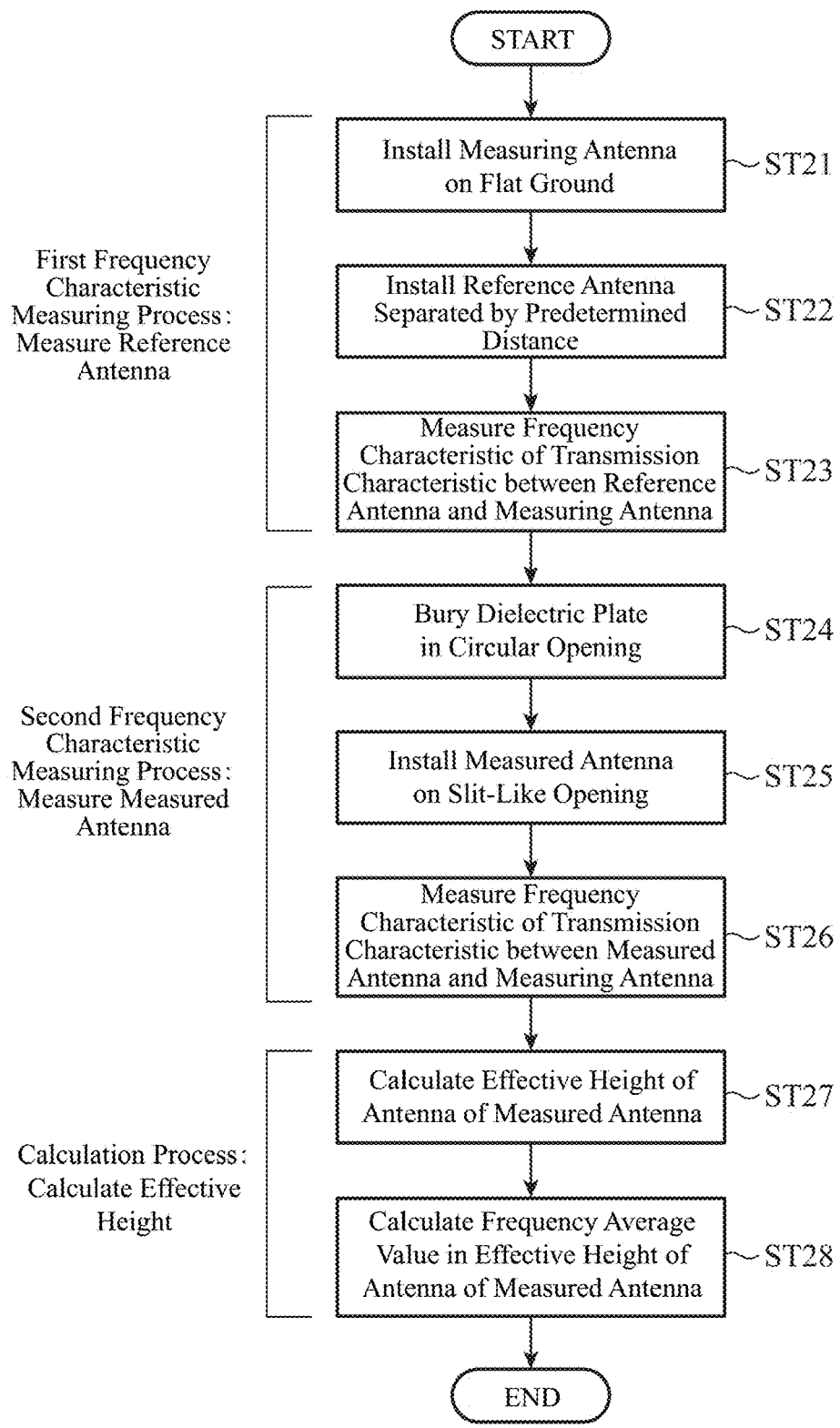
FIG. 9 is a flowchart depicting a partial discharge sensor evaluation method according to Embodiment 3 of the present invention.

FIG. 9 is a flowchart illustrating a partial discharge sensor evaluation method according to Embodiment 3 of the present invention.

FIG. 10(a) depicts a state of a side where a measuring antenna 2 is installed. FIG. 10(b) is a drawing corresponding to FIG. 10(a) as viewed from the back and depicting a state of a side where a measured antenna 16 is installed.

A state before the measured antenna 16 is installed, in other words, a state where a reference antenna 3 is measured, is similar to that of the above Embodiment 1 and corresponds to that of FIG. 2.

In FIG. 10, a slit-like opening 11 is a slit-like opening part formed at a position where the reference antenna 3 has been installed.

A dielectric plate 12 is a member corresponding to an insulating spacer 23 in FIG. 11 described below. The dielectric plate 12 is a semi-cylindrical member that has opposite end portions located at opposite ends of the slit-like opening 11 and a central portion buried in the slit-like opening 11.

Conductor plates 13, 14 are members corresponding to flanges 24, 25 in FIG. 11 described below. The conductor plates 13, 14 are arranged to sandwich the dielectric plate 12 and are each electrically connected to ground at one end.

Bolts 15 are members corresponding to bolts 26 in FIG. 11 described below.

The measured antenna 16 corresponds to a measured antenna 27 in FIG. 11 described below and is installed on the dielectric plate 12.

FIG. 11 is a perspective view depicting a high-voltage electric line installed in a GIS.

In FIG. 11, an external conductor 22 is a cylindrical member that covers a high-voltage wire 21 and is sealed with a gas having a high insulating property.

The insulating spacer 23 is provided at a predetermined interval in order to hold the high-voltage wire 21, and held with a plurality of bolts 26 with sandwiched between two flanges 24, 25.

The measured antenna 27 is installed to detect a high frequency having propagated to the exterior through the insulating spacer 23.

FIG. 10 corresponds to a portion obtained by cutting out, with a rectangle, the insulating spacer 23 and the flanges 24, 25 in FIG. 11.

The partial discharge sensor evaluation apparatus in Embodiment 3 simulates detection of the high frequency having propagated to the exterior through the insulating spacer 23 in the high-voltage electric line installed in the GIS in FIG. 11.

Next, an operation will be described.

A first frequency characteristic measuring process including steps ST21 to ST23 will be initially described.

First, similarly to the above Embodiment 1, in order to measure a frequency characteristic E_ref(f) of a transmission characteristic between the reference antenna 3 and the measuring antenna 2, the measuring antenna 2 that is a monopole antenna is installed on a flat ground 1 as depicted in FIG. 2 (step ST21 in FIG. 9).

Then, similarly to the above Embodiment 1, the reference antenna 3 for which a frequency characteristic in an effective height of antenna heff_ref(f) is known is installed on the flat ground 1 to be separated by a predetermined distance from the measuring antenna 2 (step ST22).

When the reference antenna 3 and the measuring antenna 2 are installed on the flat ground 1, the network analyzer 4 measures the frequency characteristic E_ref(f) of the transmission characteristic between the reference antenna 3 and the measuring antenna 2, similarly to the above Embodiment 1 (step ST23).

Next, a second frequency characteristic measuring process of steps ST24 to ST26 will be described.

First, the reference antenna 3 is removed from the flat ground 1, and then, the slit-like opening 11 is formed at the position where the reference antenna 3 has been installed as depicted in FIG. 10; the central portion of the dielectric plate 12 is buried in the slit-like opening 11 such that the opposite end portions of the dielectric plate 12 are located at the opposite ends of the slit-like opening 11 (step ST24).

At this time, the conductor plates 13, 14 each electrically connected to ground at the one end are placed so as to sandwich the dielectric plate 12.

Then, the measured antenna 16 is installed on the dielectric plate 12 (step ST25). When the measured antenna 16 is installed on the dielectric plate 12, the network analyzer 4 measures a frequency characteristic E_dut(f) of a transmission characteristic between the measured antenna 16 and the measuring antenna 2, similarly to the above Embodiment 1 (step ST26).

Next, a calculation process of steps ST27 and ST28 will be described.

When the frequency characteristic E_ref(f) of the transmission characteristic between the reference antenna 3 and the measuring antenna 2, and the frequency characteristic E_dut(f) of the transmission characteristic between the measured antenna 16 and the measuring antenna 2 are measured, similarly to the above Embodiment 1, the calculation apparatus 4a calculates the frequency characteristic heff(f) in the effective height of the measured antenna 16 by substituting the frequency characteristic E_ref(f) and the frequency characteristic E_dut(f) into the above Expression (1) (step ST27).

Upon calculating the frequency characteristic heff(f) in the effective height of the measured antenna 16, similarly to the above Embodiment 1, the calculation apparatus 4a calculates a frequency average value heff_average in the effective height using the above Expression (2) (step ST28).

In this case, the network analyzer 4 and the calculation apparatus 4a perform a similar measurement while the frequency of a radio wave supplied to the measuring antenna 2 (prescribed frequency) is varied, and average the frequency characteristic heff(f) in the effective height at the prescribed frequency. As the prescribed frequency, for example, the one of 500 MHz to 1500 MHz is used.

The measuring antenna 2 that is the monopole antenna installed on the flat ground 1 radiates a polarized wave perpendicular to the flat ground 1, and a high frequency propagate along the flat ground 1. Therefore, when the measuring antenna 2 and the measured antenna 16 are installed as depicted in FIG. 10, the polarized wave perpendicular to the flat ground 1 can be irradiated to a side surface of the measured antenna 16, similarly to a case where a G-TEM cell is used.

As a result, the procedure illustrated in steps ST21 to ST28 enables an evaluation that is equivalent to that in the case where the G-TEM cell is used.

In Embodiment 3, there is illustrated the case in which the single measuring antenna 2 is installed to be separated by the predetermined distance from the slit-like opening 11; however, similarly to the case in which the N measuring antennas 2 are provided in the above Embodiment 2, the N measuring antennas 2 may be provided around the slit-like opening 11, and the measured antenna 16 may be installed on the dielectric plate 12.

In this case, similarly to the above Embodiment 2, when a frequency characteristic E'_ref_i(f) of a transmission characteristic between the reference antenna 3 and the N measuring antennas 2 is measured, and also a frequency characteristic E'_dut_i(f) of a transmission characteristic between the measured antenna 16 and the N measuring antennas 2 is measured, the frequency characteristic heff(f) in the effective height of the measured antenna 16 and the frequency average value heff_average in the effective height of the measured antenna are calculated.

Embodiment 4

Figure 12:
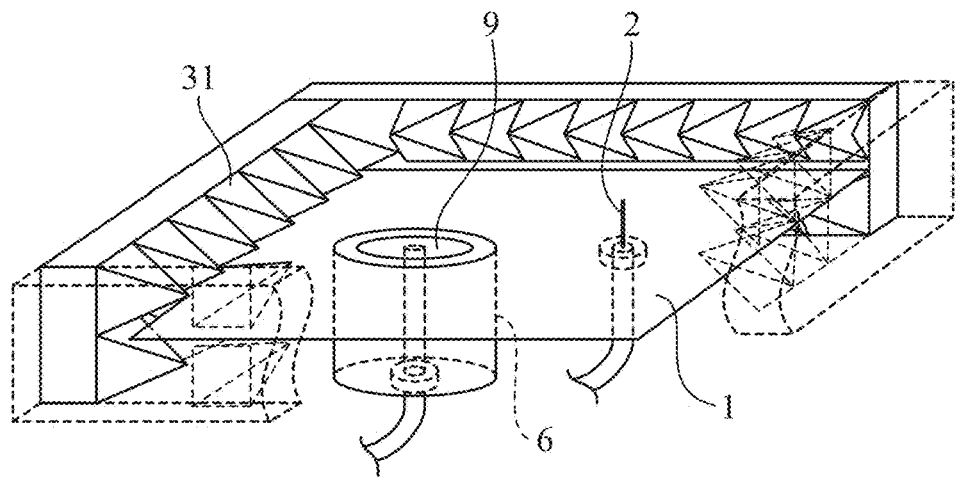
FIG. 12 is a perspective view depicting a partial discharge sensor evaluation apparatus according to Embodiment 4 of the present invention.

FIG. 12 is a perspective view depicting a partial discharge sensor evaluation apparatus according to Embodiment 4 of the present invention. In FIG. 12, the same reference numerals as those in FIG. 5 designate identical or corresponding portions, and explanations thereof will be thus omitted.

A radio wave absorber 31 is a pyramidal radio wave absorber installed around a flat ground 1.

FIG. 12 depicts an example where the radio wave absorber 31 is installed with respect to the partial discharge sensor evaluation apparatus illustrated in the above Embodiment 1. However, the radio wave absorber 31 may be installed with respect to the partial discharge sensor evaluation apparatus illustrated in the above Embodiments 2 and 3.

When the transmission characteristic is measured using any of the partial discharge sensor evaluation methods illustrated in the above Embodiments 1 to 3, scattering waves from an edge portion of the flat ground 1 may become an error factor.

In Embodiment 4, the radio wave absorbers 31 are arranged along the edge portion in order to reduce the scattering waves from the edge portion of the flat ground 1.

As a result, the error factor resulting from the scattering waves from the edge portion can be reduced, which makes it possible to enhance measurement accuracy in an effective height of antenna.

Figure 13:
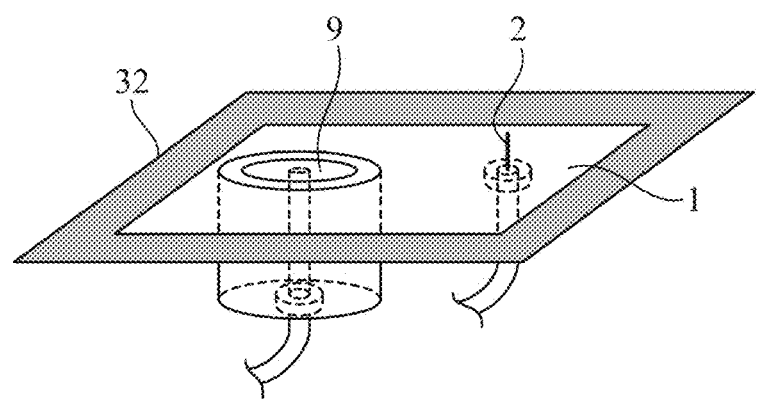
FIG. 13 is a perspective view depicting another partial discharge sensor evaluation apparatus according to Embodiment 4 of the present invention.

In Embodiment 4, there is illustrated the example where the pyramidal radio wave absorbers 31 are installed around the flat ground 1. However, as depicted in FIG. 13, a radio wave absorber 32 may be applied at a periphery of the flat ground 1, which produces a similar advantageous effect.

Figure 14:
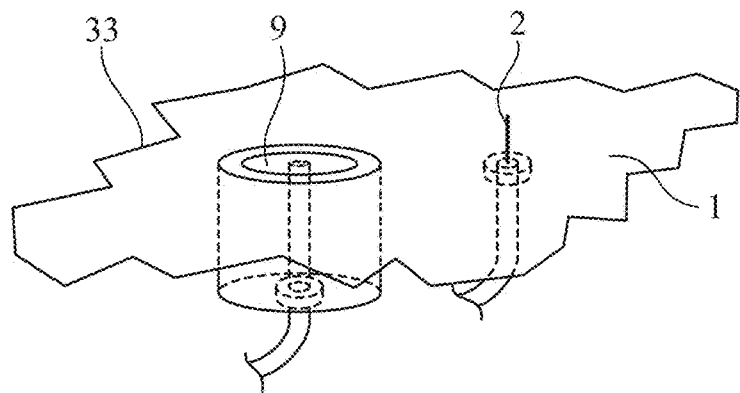
FIG. 14 is a perspective view depicting another partial discharge sensor evaluation apparatus according to Embodiment 4 of the present invention.

In Embodiment 4, there is illustrated the example where the pyramidal radio wave absorbers 31 are installed around the flat ground 1. However, as depicted in FIG. 14, a cut 33 may be provided on an edge portion at the periphery of the flat ground 1.

The cut 33 provided on the edge portion causes the scattering waves to be dispersed in various directions, and thus, the error factor resulting from the scattering waves from the edge portion can be reduced, which makes it possible to enhance the measurement accuracy in the effective height of antenna.

Figure 15:
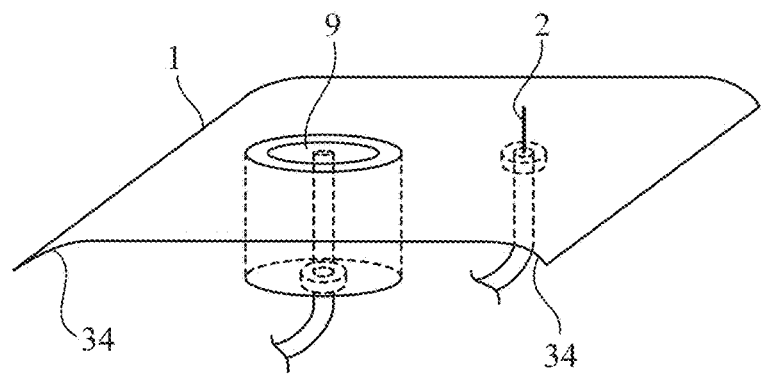
FIG. 15 is a perspective view depicting another partial discharge sensor evaluation apparatus according to Embodiment 4 of the present invention.
Figure 16:
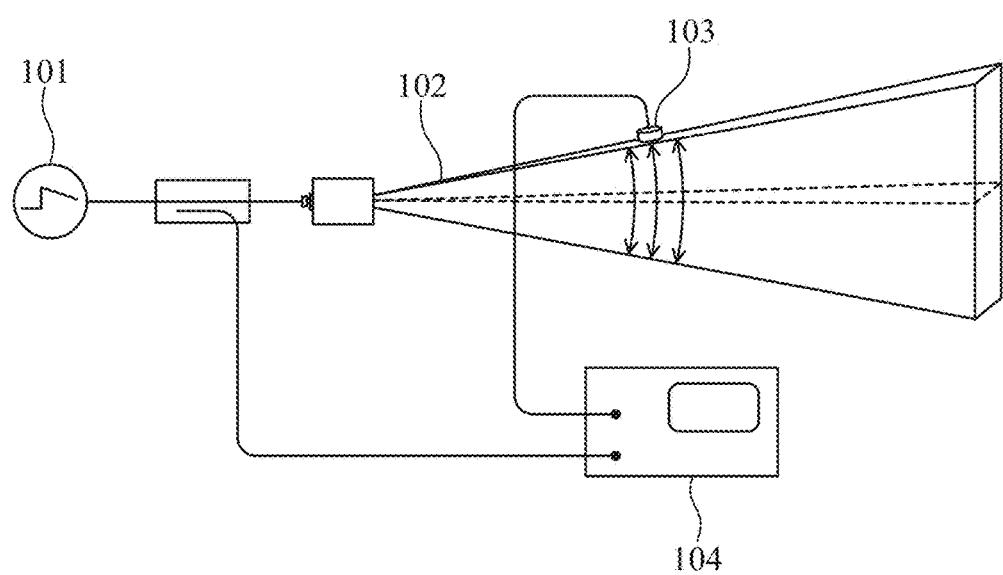
FIG. 16 is a configuration diagram depicting a partial discharge sensor evaluation apparatus disclosed in Non-Patent Literature 1.

In Embodiment 4, there is illustrated the example where the pyramidal radio wave absorbers 31 are installed around the flat ground 1. However, as depicted in FIG. 15, the edge portion at the periphery of the flat ground 1 may be curved toward a side opposite to the measuring antenna 2. 34 designates a curved surface of the edge portion.

Waves propagating on the flat ground 1 have the property of propagating along the curved surface 34, which makes it possible to scatter a radio wave in an area that is out of sight from the measured antenna 9 and/or the measuring antenna 2. As a result, the amount of scattering waves reaching the measured antenna 9 or the measuring antenna 2 is reduced, which makes it possible to enhance the measurement accuracy.

In the present invention, the embodiments may be freely combined with one another, any components of the embodiments may be varied, or any components of the embodiments may be omitted without departing from the scope of the present invention.

INDUSTRIAL APPLICABILITY

The partial discharge sensor evaluation method according to the present invention is suitable for a case where it is necessary to achieve downsizing of an apparatus used in detecting a high frequency generated in an apparatus of a high-power facility such as a GIS to thus detect a partial discharge phenomenon.

DESCRIPTION OF REFERENCE NUMERALS and SIGNS

1 Flat ground
2 Measuring antenna
3 Reference antenna
4 Network analyzer (transmission characteristic measurer)
4a Calculation apparatus (effective-high-frequency characteristic calculator)
5 Circular opening
6 Cylindrical ground
7 Flange
8 Antenna ground
9 Measured antenna
10 Network analyzer (transmission characteristic measurer)
10a Calculation apparatus (effective-high-frequency characteristic calculator)
11 Slit-like opening
12 Dielectric plate
13, 14 Conductor plates
15 Bolt
16 Measured antenna
21 High-voltage wire
22 External conductor
23 Insulating spacer
24, 25 Flanges
26 Bolt
27 Measured antenna
31, 32 Radio wave absorbers
33 Cut
34 Curved surface
101 Signal source
102 G-TEM cell
103 Partial discharge sensor
104 Digitizer.

The invention claimed is:

1. A partial discharge sensor evaluation method comprising:
a first frequency characteristic measuring process in which, in a state where a reference antenna for which a frequency characteristic in an effective height is known and a measuring antenna are installed on a flat ground to be separated by a predetermined distance from each other, a transmission characteristic measurer measures a frequency characteristic of a transmission characteristic between the reference antenna and the measuring antenna;

a second frequency characteristic measuring process in which, in a state where the reference antenna is removed, and a measured antenna is installed in a side direction of the measuring antenna and connected to the flat ground inside a cylindrical ground buried in a circular opening formed at a position where the reference antenna has been installed, and the measuring antenna radiates a polarized wave perpendicular to the flat ground with respect to a side surface of the measured antenna, the transmission characteristic measurer measures the frequency characteristic of the transmission characteristic between the measured antenna and the measuring antenna; and a calculation process in which a calculation apparatus calculates the frequency characteristic in an effective height of the measured antenna based on the frequency characteristic of the transmission characteristic measured in the first frequency characteristic measuring process and the frequency characteristic of the transmission characteristic measured in the second frequency characteristic measuring process, wherein the calculated frequency characteristic in an effective height is used to determine an index value for a partial discharge sensor.

2. The partial discharge sensor evaluation method according to claim 1, wherein in the calculation process, the frequency characteristic in the effective height of the measured antenna is calculated based on the frequency characteristic of the transmission characteristic measured in the first frequency characteristic measuring process and the frequency characteristic of the transmission characteristic measured in the second frequency characteristic measuring process, and a frequency average value in the effective height is also calculated.

3. The partial discharge sensor evaluation method according to claim 1, wherein, in the first frequency characteristic measuring process, in a state where a plurality of the measuring antennas are arranged around the reference antenna, the transmission characteristic measurer measures the frequency characteristic of the transmission characteristic between the reference antenna and the plurality of measuring antennas, in the second frequency characteristic measuring process, the transmission characteristic measurer measures the frequency characteristic of the transmission characteristic between the measured antenna and the plurality of measuring antennas, and in the calculation process, an electric field at a point separated by a predetermined distance or longer from the reference antenna is calculated based on the frequency characteristic of the transmission characteristic measured in the first frequency characteristic measuring process, and also the electric field at the point separated by the predetermined distance or longer from the measured antenna is calculated based on the frequency characteristic of the transmission characteristic measured in the second frequency characteristic measuring process, and the frequency characteristic in the effective height of the measured antenna is calculated based on the electric fields at both the points.

4. The partial discharge sensor evaluation method according to claim 3, wherein in the calculation process, the frequency characteristic in the effective height of the measured antenna is calculated based on the electric fields at both the points, and a frequency average value in the effective height is also calculated.

5. A partial discharge sensor evaluation apparatus comprising:

a measuring antenna installed on a flat ground;

a reference antenna which is installed on the flat ground to be separated by a predetermined distance from the measuring antenna, and for which a frequency characteristic in an effective height is known;

a cylindrical ground in which the reference antenna is removed, and which is buried in a circular opening formed at a position where the reference antenna has been installed;

a measured antenna installed inside the cylindrical ground in a side direction of the measuring antenna and connected to the flat ground, the measuring antenna radiating a polarized wave perpendicular to the flat ground with respect to a side surface of the measured antenna;

a transmission characteristic measurer that measures the frequency characteristic of a transmission characteristic between the reference antenna and the measuring antenna and also that measures the frequency characteristic of the transmission characteristic between the measured antenna and the measuring antenna; and a calculation apparatus that calculates the frequency characteristic in the effective height of the measured antenna based on the frequency characteristics of both the transmission characteristics measured by the transmission characteristic measurer, wherein the calculated frequency characteristic in an effective height is used to determine an index value for a partial discharge sensor.

6. The partial discharge sensor evaluation apparatus according to claim 5, wherein a plurality of the measuring antennas is arranged around a position where the reference antenna and the measured antenna are installed, the transmission characteristic measurer measures the frequency characteristic of the transmission characteristic between the reference antenna and the plurality of measuring antennas, and also measures the frequency characteristic of the transmission characteristic between the measured antenna and the plurality of measuring antennas, and the calculation apparatus calculates an electric field at a point separated by the predetermined distance or longer from the reference antenna based on the frequency characteristic of the transmission characteristic between the reference antenna and the plurality of measuring antennas measured by the transmission characteristic measurer, and also calculates the electric field at the point separated by the predetermined distance or longer from the measured antenna based on the frequency characteristic of the transmission characteristic between the measured antenna and the plurality of measuring antennas measured by the transmission characteristic measurer, and calculates the frequency characteristic in the effective height of the measured antenna based on the electric fields at both the points.

7. The partial discharge sensor evaluation apparatus according to claim 5, wherein a radio wave absorber is installed or applied around the flat ground.

8. The partial discharge sensor evaluation apparatus according to claim 5, wherein a cut is provided on an edge portion at a periphery of the flat ground.

9. The partial discharge sensor evaluation apparatus according to claim 5, wherein an edge portion at a periphery of the flat ground is curved toward a side opposite to the measuring antenna.

* * * * *